United States Patent [19]

Takeda et al.

[11] Patent Number: 4,585,706
[45] Date of Patent: Apr. 29, 1986

[54] SINTERED ALUMINUM NITRIDE SEMI-CONDUCTOR DEVICE

[75] Inventors: Yukio Takeda; Satoru Ogihara; Mitsuru Ura; Kousuke Nakamura, all of Hitachi; Tadamichi Asai, Ibaraki; Tokio Ohkoshi, Hitachi; Yasuo Matsushita, Hitachi; Kunihiro Maeda, Hitachi, all of Japan

[73] Assignee: Hitachi, Ltd., Tokyo, Japan

[21] Appl. No.: 769,302

[22] Filed: Aug. 26, 1985

Related U.S. Application Data

[62] Division of Ser. No. 373,150, Apr. 29, 1982, Pat. No. 4,540,673.

[30] Foreign Application Priority Data

Apr. 30, 1981 [JP] Japan ................................. 56-66376

[51] Int. Cl.[4] ...................... H01L 29/12; B32B 15/04
[52] U.S. Cl. ................................. 428/620; 428/627; 428/641; 428/698; 501/96; 264/61; 174/16 HS
[58] Field of Search ................ 428/620, 627, 641, 698

[56] References Cited

U.S. PATENT DOCUMENTS 4,364,100  12/1982  Edmonds et al. ............... 156/89 X

FOREIGN PATENT DOCUMENTS 0032073  2/1983  Japan .................................. 501/96

Primary Examiner—William R. Dixon, Jr.
Assistant Examiner—Karl Group
Attorney, Agent, or Firm—Antonelli, Terry & Wands

[57] ABSTRACT

A semi-conductor device comprising sintered aluminum nitride having a high thermal conductivity, which comprises at least 65% by weight of aluminum nitride, and at least one of beryllium, a beryllium compound, lithium and a lithium compound.

11 Claims, 6 Drawing Figures

SINTERED ALUMINUM NITRIDE SEMI-CONDUCTOR DEVICE

This is a division of application Ser. No. 373,150, filed 4/29/82, now U.S. Pat. No. 4,540,673.

BACKGROUND OF THE INVENTION

The present invention relates to a sintered aluminum nitride suitable for insulating substrates for integrated circuits, etc., and more particularly to sintered aluminum nitride having a high thermal conductivity, a high electrical resistivity, and a low coefficient of thermal expansion.

The semiconductor industry has made a remarkable progress in recent years and a number of circuit constituents such as semiconductor chips have been formed in increasingly higher density on an insulating substrate used in large scale integrated circuit and the like. Demands for devices having greater capacity with smaller size have also become keener and insulating substrates having a high thermal conductivity have been in demand.

As materials for such an insulating substrate, there has conventionally been employed sintered alumina. Since the sintered alumina does not have a satisfactory thermal conductivity and development of an insulating substrate having a higher thermal conductivity has been requested. The insulating substrate for such an application must satisfy the following requirements.

(1) high electrically insulating property,
(2) high thermal conductivity,
(3) its coefficient of thermal expansion is approximate to that of silicon,
(4) high mechanical strength, and
(5) low dielectric constant.

Sintered silicon carbide has been proposed to satisfy the foregoing requirements, but still has a problem in obtaining a high density sintered silicon carbide with a high electrical resistivity, and various improvements have been therefore proposed. That is, various sintering aids have been employed in order to obtain a high density sintered silicon carbide. U.S. Pat. No. 4,172,109, for example, discloses a sintered silicon carbide containing beryllium as a sintering aid. This prior art relates to a high strength material obtained by sintering powder of silicon carbide which contains 0.5 to 5 wt.% of excessive carbon. However, the sintered silicon carbide thus formed has small electric resistivity and cannot be used as an electrically insulating material.

On the other hand, U.S. Patent Application Ser. No. 203,554 filed Nov. 5, 1980 discloses sintered silicon carbide containing 0.1–3.5 wt.% beryllium, which has a thermal conductivity of at least 0.4 cal/cm.sec.°C. at 25° C., an electrical resistivity of at least $10^7$ ohm.cm at 25° C. and a coefficient of thermal expansion of $3.3-4 \times 10^{-6}$/°C. at 25° C. to 300° C. However, in that case, the firing temperature is as high as 1,850°–2,500° C., and a new material, which can be fired economically at a lower temperature and has a higher electrical resistance, has been in demand.

As a substitute for the sintered silicon carbide, sintered aluminum nitride has been regarded as important, because sintered aluminum nitride has a coefficient of about $5 \times 10^{-6}$/°C., which is smaller than that of sintered alumina, about $7 \times 10^{-6}$/°C., and is nearly as low as that of silicon, about $3.3 \times 10^{-6}$/°C., a flexural strength of about 50 kg/mm², which is much higher than that of sintered alumina, about 20 kg/mm², and also has a good electrically insulating property.

The well known methods for preparing sintered aluminum nitride include (1) a reaction sintering method, (2) normal pressure sintering method, and (3) hot press sintering method [Journal of Material Science 4 (1969) 1045-1050; Journal of The American Ceramic Society-Discussions and Notes, 57 No. 9, 411–412]. The reaction sintering method is to sinter metallic aluminum molding while subjecting it to nitrizing reaction in a nitrogen gas atmosphere, where the rate of nitrizing reaction is dependent upon diffusion of nitrogen gas, so that, in the case of a thick molding, unreacted aluminum remains at the center part and the sintered molding is porous, so that it cannot be practically used as an electrically insulating material.

The normal pressure sintering method is to sinter a molding of a mixture of aluminum nitride powder and a powdery additive of yttrium oxide and a rare earth element oxide, or yttrium oxide and silicon dioxide, nickel and/or calcium oxide.

The hot press sintering method is to sinter a molding of a mixture of aluminum nitride powder and a powery additive of aluminum oxide, or yttrium oxide and silicon dioxide, or the like with heating under pressure. According to the known normal pressure sintering method and hot press sintering method, compact sintered aluminum nitride with a high mechanical strength, a high electrically insulating property and a low coefficient of thermal expansion can be obtained. However, the sintered aluminum nitride has a low thermal conductivity, usually 0.07 cal/cm.sec.°C. and at most 0.1 cal/cm.sec.°C. at room temperature. Thus, sintered aluminum nitride having a higher coefficient of thermal conductivity, if available, will be very useful as an insulating substrate material for large scale integrated circuits etc.

SUMMARY OF THE INVENTION

An object of the present invention is to provide sintered aluminum nitride having a high thermal conductivity, a high electrical resistivity and a low coefficient of thermal expansion, and also to provide a semi-conductor device using the same as an insulating substrate.

The present invention provides sintered aluminum nitride comprising at least 65% by weight of aluminum nitride and at least one of beryllium, a beryllium compound, lithium, and a lithium compound, and a semiconductor device using the same as an insulating substrate.

Sintered aluminum nitride having a thermal conductivity of 0.2 cal/cm.sec.°C. or higher at 25° C., an electrical resistivity of $10^{12}$ Ω.cm or higher at 25° C., an average coefficient of thermal expansion of $6 \times 10^{-6}$/°C. or lower in a range of 25° to 300° C., and a density of at least 90% of the theoretical density of sintered aluminum nitride can be obtained by adjusting an amount of at least one of beryllium, beryllium compound, lithium, and lithium compound to be added, and also by adjusting firing conditions.

The present sintered aluminum nitride containing at least one of beryllium, a beryllium compound, lithium, and a lithium compound can be prepared by mixing 0.05 to 10% by weight of at least one of beryllium and a beryllium compound in terms of beryllium atom, or 0.5 to 5% by weight of at least one of lithium and a lithium compound in term of lithium atom, or 0.05 to 10% by weight of at least one of beryllium and a beryllium compound and 0.05 to 5% by weight of at least one of lithium and a lithium compound in terms of beryllium and, lithium atoms, respectively, where if the lithium or the lithium compound takes the major proportion, the sum total of at least one of the beryllium and the beryllium compound and at least one of the lithium and the lithium compound is not more than 5% by weight in terms of beryllium and lithium atoms, and if the beryllium content takes the major proportion, the sum total of at least one of the beryllium and the beryllium compound and at least one of the lithium and the lithium compound is not more than 10% by weight in terms of beryllium and lithium atoms, into aluminum nitride powder having an average particle size of 20 $\mu$m or less on the basis of aluminum nitride, compression-molding the resulting mixture, and sintering the resulting molding in a non-oxidizing atmosphere at a temperature of 1,600° to 2,000° C. under normal pressure, or hot-pressing the resulting mixture at a temperature of 1,600° to 2,000° C. under a pressure of 100 kg/cm$^2$ or higher in a non-oxidizing atmosphere, for a time enough to obtain at least 90% of theoretical density of sintered product.

A preferable beryllium content of the present sintered aluminum nitride is 0.05 to 10% by weight in terms of beryllium atom on the basis of aluminum nitride. To obtain a compact sintered product, not less than 0.05% by weight is preferable, while, to obtain a sintered product having a coefficient of thermal expansion of $6 \times 10^{-6}$/°C., not more than 10% by weight is preferable. The thus obtained sintered product is particularly suitable for an insulating substrate for silicon semi-conductor element and other semi-conductor elements.

The beryllium compound to be added to the aluminum nitride powder includes, for exmple, beryllium nitrate, beryllium sulfate, beryllium carbonate, beryllium phosphate, beryllium hydroxide, beryllium halides such as beryllium chloride and beryllium fluoride, beryllium acetylacetonate, beryllium oxalate, beryllium carbide, beryllium boride, beryllium silicide, beryllium nitride, and beryllium oxide, which can be used alone or in combination.

A preferable lithium content of the present sintered aluminum nitride is at least 0.05% by weight in terms of lithium atom on the basis of aluminum nitride. To prevent dissipation of lithium or a lithium compound at the firing to obtain a compact sintered product, not more than 5% by weight is preferable.

The lithium compound includes, for example, lithium oxide, lithium halides such lithium chloride and lithium fluoride, lithium nitrate, lithium carbonate and lithium sulfate, which can be used alone or in combination.

If both beryllium or the beryllium compound and lithium or the lithium compound are contained in the present sintered product, their content is in a range of 0.05 to 10% by weight of at least one of beryllium and a beryllium compound and 0.05 to 5% by weight of at least one of lithium and a lithium compound in terms of beryllium and lithium atoms, respectively on the basis of aluminum nitride, where if the lithium or the lithium compound takes the major proportion in the content, the sum total of at least one of the beryllium and the beryllium compound and at least one of the lithium and the lithium compound is not more than 5% by weight in terms of beryllium and lithium atoms, and if the beryllium content takes the major proportion in the content, the sum total of at least one of the beryllium and the beryllium compound and at least one of the lithium and the lithium compound is not more than 10% by weight in terms of beryllium and lithium atoms.

The beryllium, beryllium compound, lithium and/or lithium compound can be mixed with aluminum nitride powder in the form of powder or solution.

The mixing can be carried out in any known apparatus or by any known means, and the resulting homogeneous mixture can be compression-molded into any desired shape at room temperature.

When at least one of $Y_2O_3$, MgO, $Al_2O_3$ and $SiO_2$ is contained in aluminum nitride as a sintering aid in addition to beryllium, beryllium compound, lithium and lithium compound, these sintering aids act as impurities in the aluminum nitride, giving rise to disorder in the aluminum nitride crystal lattice and to consequent decrease in thermal conductivity. However, addition of beryllium, a beryllium compound, lithium or a lithium compound can improve the thermal conductivity. These sintering aids can reduce the amount of beryllium, a beryllium compound, lithium or a lithium compound to be added, but a sintered product having a higher thermal conductivity can be obtained if no such sintering aids are contained. It is preferable that the content of these sintering aids is not more than 5% by weight in their total, and is less than the total beryllium and lithium content in terms of atoms on the basis of aluminum nitride.

It is preferable that aluminum nitride powder has an average particle size of 20 $\mu$m or less, preferably 10 $\mu$m or less.

It is preferable to sinter a molding of a mixture of aluminum nitride powder with at least one of beryllium, a beryllium compound, lithium and a lithium compound in a non-oxidizing atmosphere, because aluminum nitride is oxidized in an oxidizing atmosphere, so that the desired sintered product is difficult to obtain.

Effective sintering temperature is 1,600° to 2,000° C., preferably 1,700° to 1,900° C. To obtain a compact sintered product, not less than 1,600° C. is preferable, whereas to prevent overfiring, not more than 2,000° C. is preferable. Sintering can be carried out according to the normal pressure sintering method or the hot press method. When sintering is carried out according to a hot press method of uniaxial compression type, shrinkage takes place only in the direction of compressing axis, and a sintered product having a high dimensional precision and a higher mechanical strength than that attained according to the normal pressure sintering method can be obtained. In the hot press method, the upper limit of a compression load depends upon the quality of a die to be used, but the desired sintered product can be obtained from any die, so long at it can withstand a load of at least 100 kg/cm$^2$.

An optimum sintering time depends upon the particle size of raw material powder, species and amount of beryllium, beryllium compound, lithium or lithium compound, sintering temperature and an applying load, when applied at the sintering. Generally, a compact sintered product can be obtained for a short time when a molding of raw material powder of smaller particle size is sintered under a load, particularly a larger load, at a higher sintering temperature.

A binder can be used for preparing a molding and includes, for example, such organic materials as polyvinyl alcohol, phenol resin, silicone resin, etc., and particularly polyvinyl alcohol and silicone resin are preferable because they will leave no carbon in sintered products.

The sintered product is comprised of aluminum nitride grains and additive grains. The additive grains form the secondary phase in the sintered product. The dissolved content of the additive materials in the aluminum nitride is very small.

DETAILED DESCRIPTION OF THE PREFERRED EMBODIMENTS

Figure 1:
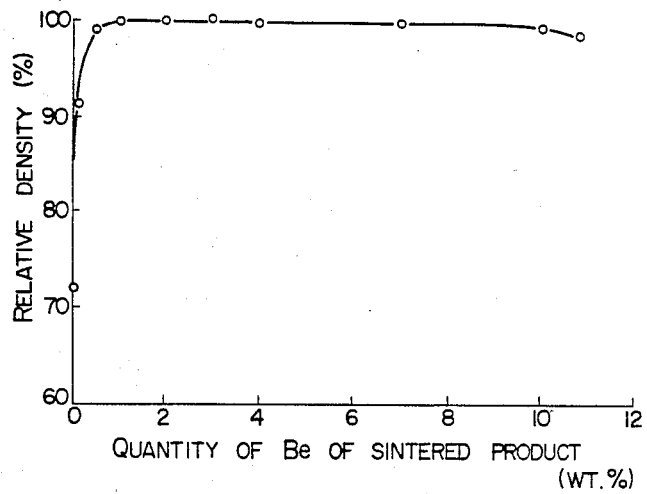
FIG. 1 is a diagram showing the relationship between the Be quantity in the sintered product and the relative density of the sintered product.
Figure 2:
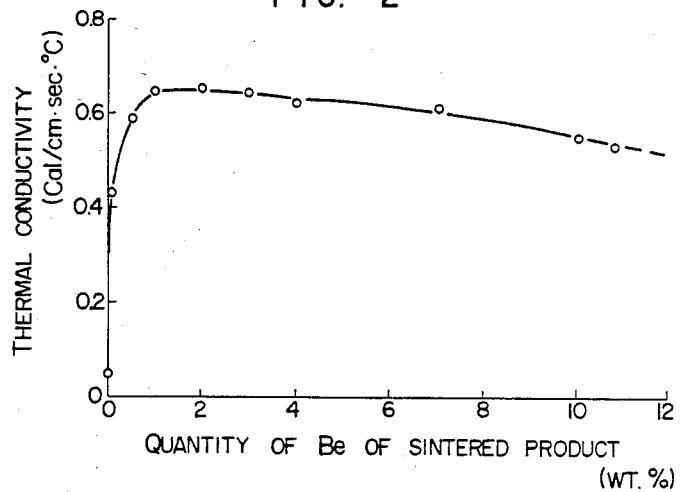
FIG. 2 is a diagram showing the relationship between the Be quantity and the thermal conductivity of the sintered product at 25° C.

Hereinafter, the present invention will be described more definitely with reference to embodiments thereof.

Example 1

Aluminum nitride powder having a purity of 99% and an average particle size of 2 μm was mixed with 0.03 to 30% by weight of beryllium oxide powder having an average particle size of 3 μm in terms of beryllium atom on the basis of aluminum nitride powder, and further admixed with 2 cc of an aqueous 3% polyvinyl alcohol solution per 40 g of the resulting powdery mixtures. Then, the mixtures were molded under the pressure of 1,000 kg/cm² at room temperature, and the resulting moldings were sintered in a furnace under a vacuum of $1 \times 10^{-3}$ to $1 \times 10^{-5}$ Torr. The moldings were heated by elevating a heating temperature from room temperature to 1,800° C. over about one hour, and kept at 1,800° C. for half an hour, and then left for cooling. The relations between the characteristics of the resulting sintered aluminum nitride products and beryllium content thereof are shown in FIGS. 1 to 4.

It is seen from FIGS. 1 to 4 that, when the beryllium content of sintered aluminum nitride is 0.05% by weight or higher, compact sintered products having a high thermal conductivity, i.e. 0.3 cal/cm.sec.°C. or higher at room temperature, an electrical resistivity of $10^{12}$ Ωcm or higher at room temperature, a low coefficient of thermal expansion of $6 \times 10^{-6}$/°C. below 10.5% by weight, and a density of more than 90% of theoretical density of sintered products (which will be hereinafter referred to as "relative density") can be obtained.

Example 2

Moldings of mixtures of aluminum nitride powder having a purity of 99% with 3% by weight of beryllium oxide in terms of beryllium atom on the basis of aluminum nitride powder were prepared and sintered in the vacuum in the same manner as in Example 1, while changing the sintering conditions. Table 1 shows relations between the conditions for sintering the moldings and the relative density of sintered products. The sintered products having a relative density of 90% or higher had a thermal conductivity of 0.4 cal/cm.sec.°C. or higher at room temperature, an electrical resistivity of $10^{12}$ Ωcm or higher at room temperature, and an average coefficient of thermal expansion of 4.2 to $4.3 \times 10^{-6}$/°C. between room temperature and 300° C.

TABLE 1

| Sintering temp. (°C.) | Sintering time (h) | Pressure (Kg/cm²) | Relative density (%) |
|---|---|---|---|
| 1550 | 1.0 | — | 78 |
| 1600 | 1.0 | — | 93 |
| 1600 | 0.5 | — | 90 |
| 1800 | 0.5 | — | 100 |
| 2000 | 0.5 | — | 96 |
| 2000 | 0.2 | — | 98 |
| 2100 | 0.5 | — | 85 |
| 2100 | 0.2 | — | 89 |
| 1550 | 1.0 | 300 | 85 |
| 1600 | 0.5 | 300 | 98 |
| 1600 | 0.5 | 100 | 95 |
| 1600 | 0.5 | 50 | 87 |
| 1800 | 0.2 | 300 | 98 |
| 1800 | 0.5 | 300 | 100 |
| 2000 | 0.5 | 300 | 98 |
| 2000 | 0.2 | 300 | 98 |
| 2000 | 0.2 | 100 | 97 |
| 2100 | 0.5 | 100 | 83 |
| 2100 | 0.2 | 100 | 88 |
| 2100 | 0.2 | 300 | 86 |

Example 3

Moldings of mixtures of aluminum nitride powder having a purity of 99% with 3% by weight of beryllium oxide in terms of beryllium atom on the basis of aluminum nitride powder were prepared and sintered in the same manner as in Example 1, while using various sintering atmospheres of argon gas, helium gas, nitrogen gas and hydrogen gas. The resulting sintered products had the same properties as those of the sintered products with 1% beryllium content in Example 1.

Example 4

Aluminum nitride powder having a purity of 99% was admixed with 0.03 to 10% by weight of one of metallic beryllium, beryllium nitrate, beryllium sulfate, beryllium carbonae, beryllium phosphate, beryllium hydroxide, beryllium chloride, beryllium fluoride, beryllium acetylacetonate, beryllium oxalate, beryllium carbide, beryllium boride, beryllium silicide, and beryllium nitride, in terms of atom, on the basis of aluminum nitride in the manner as in Example 1. When the beryllium content of the sintered products was 0.05% by weight or higher, compact sintered products having a relative density of 90% or higher were obtained, and had the similar properties as those of the sintered products obtained in Example 1.

Example 5

Aluminum nitride powders having a purity of 99% and different average particle sizes were admixed with 3% by weight of beryllium oxide powder in terms of beryllium atom on the basis of aluminum nitride, and sintered in the same manner as in Example 1. When the average particle size of the aluminum nitride powders was not more than 20 μm, sintered products having a relative density of 90% or higher were obtained. The compact sintered products having a relative density of 90% or higher had a thermal conductivity of 0.4 cal/cm.sec.°C. or higher at room temperature, an electrical resistivity of $10^{12}$ Ω.cm or higher at room temperature, and an average coefficient of thermal expansion of 4.2–4.3×10⁻⁶/°C. between room temperature and 300° C.

TABLE 2

| Average particle size (μm) | Relative density (%) |
|---|---|
| 0.5 | 99 |
| 1 | 99 |
| 2 | 99 |
| 6 | 97 |
| 10 | 95 |
| 16 | 92 |
| 20 | 90 |
| 24 | 81 |

Example 6

Aluminum nitride powder having a purity of 99% and an average particle size of 2 μm was admixed with 0.03 to 10% by weight of lithium carbonate having an average particle size of 5 μm in terms of lithium atom on the basis of aluminum nitride, and further admixed with 2 cc of an aqueous 3% polyvinyl alcohol solution per 40 g of the resulting powdery mixtures. Then, the resulting mixtures were molded under a pressure of 1,000 kg/cm² at room temperature, and the resulting moldings were sintered in a furnace under a vacuum of 1×10⁻³ to 1×10⁻⁵ Torr. The moldings were heated by elevating a heating temperature from room temperature to 1,800° C. over about one hour, and kept at 1,800° C. for half an hour, and then left for cooling. Table 3 shows the characteristics of the resulting sintered products. When the lithium content was 0.05 to 5% by weight in the resulting sintered product, the sintered products had a thermal conductivity of 0.2 cal/cm·sec.°C. or higher at room temperature, an electrical resistivity of $10^{12}$ Ωcm or higher at room temperature, and a coefficient of thermal expansion of $5\times10^{-6}$/°C. or less at room temperature, and were compact ones having a relative density of 90% or higher.

TABLE 3

| Lithium content (wt. %) | Relative density (%) | Thermal conductivity (cal/cm·s·°C.) | Electrical resistivity (Ω·cm) | Coefficient of thermal expansion (×10⁻⁶/°C.) |
|---|---|---|---|---|
| 0.03 | 73 | 0.04 | $5\times10^{11}$ | 4.2 |
| 0.05 | 90 | 0.20 | $2\times10^{14}$ | 4.2 |
| 0.1 | 95 | 0.33 | $5\times10^{14}$ | 4.2 |
| 1 | 99 | 0.52 | $8\times10^{14}$ | 4.3 |
| 3 | 99 | 0.47 | $8\times10^{14}$ | 4.3 |
| 5 | 96 | 0.39 | $3\times10^{14}$ | 4.6 |
| 10 | 87 | 0.08 | $7\times10^{13}$ | 5.7 |

Example 7

Aluminum nitride powder having a purity of 99% was admixed with 1% by weight of lithium carbonate in terms of lithium atom on the basis of aluminum nitride and sintered in the same manner as in Example 6, while changing sintering conditions. Table 4 shows relations between the sintering conditions and the relative density of the resulting sintered products. Compact sintered products having a relative density of 90% or higher all had a thermal conductivity of 0.2 cal/cm.sec.°C. or higher at room temperature, an electrical resistivity of $10^{12}$ Ωcm or higher at room temperature, and an average coefficient of thermal expansion of 4.2–4.3×10⁻⁶/°C. between room temperature and 300° C.

TABLE 4

| Temp. (°C.) | Time (hr) | Load (Kg/cm²) | Relative density (%) |
|---|---|---|---|
| 1550 | 1.0 | — | 69 |
| 1600 | 1.0 | — | 93 |
| 1600 | 0.5 | — | 91 |
| 1800 | 0.5 | — | 99 |
| 2000 | 0.5 | — | 98 |
| 2000 | 0.2 | — | 95 |
| 2100 | 0.5 | — | 82 |
| 2100 | 0.2 | — | 88 |
| 1550 | 1.0 | 300 | 85 |
| 1600 | 0.5 | 300 | 96 |
| 1600 | 0.5 | 100 | 95 |
| 1600 | 0.5 | 50 | 86 |
| 1800 | 0.2 | 300 | 98 |
| 1800 | 0.5 | 300 | 99 |
| 2000 | 0.5 | 300 | 99 |
| 2000 | 0.2 | 300 | 99 |
| 2000 | 0.2 | 100 | 96 |
| 2100 | 0.5 | 100 | 89 |
| 2100 | 0.2 | 100 | 85 |
| 2100 | 0.2 | 300 | 89 |

Example 8

Aluminum nitride powder having a purity of 99% was admixed with 1% by weight of lithium carbonate in terms of lithium atom on the basis of aluminum nitride and sintered in the same manner as in Example 6, while using a sintering atmosphere of argon gas, halium gas, nitrogen gas or hydrogen gas. The resulting sintered products all had the same characteristics as those of the sintered products having a lithium of 1% by weight as shown in Example 6.

Example 9

Aluminum nitride powders having a purity of 99% were admixed with 0.03–10% by weight of one of lithium oxide, lithium nitride, lithium hydride, lithium hydroxide, lithium chloride, lithium fluoride, lithium nitrate, and lithium sulfate in terms of lithium atom on the basis of aluminum nitride and sintered in the same manner as in Example 6. The resulting sintered products all had substantially same characteristics as those of the sintered products having corresponding lithium contents as shown in Example 6.

Example 10

Aluminum nitride powders having a purity of 99% and different average particle sizes were admixed with 1% by weight of lithium carbonate in terms of lithium atom on the basis of the aluminum nitride, and sintered in the same manner as in Example 6. Table 5 shows the relation between the average particle size of the aluminum nitride powder and the relative density of the sintered products. When the average particle size of aluminum nitride was not more than 20 μm, compact sintered products having a relative density of 90% or higher were obtained. The compact sintered products having a relative density of 90% or higher had a thermal conductivity of 0.2 cal/cm.sec.°C. or higher at room temperature, an electrical resistivity of $10^{12}$ Ωcm or higher at room temperature and an average coefficient of thermal expansion of 4.2–4.3×10⁻⁶/°C. between room temperature and 300° C.

TABLE 5

| Average particle size (μm) | Relative density (%) |
|---|---|
| 0.5 | 99 |
| 1 | 99 |
| 2 | 99 |
| 6 | 97 |
| 10 | 95 |
| 16 | 91 |
| 20 | 90 |
| 24 | 77 |

Example 11

Aluminum nitride powder having a purity of 99% was admixed with 1% by weight each of beryllium oxide powder as used in Example 1 and lithium carbonate as used in Example 6 in terms of atoms on the basis of aluminum nitride, and sintered in the same manner as in Example 1. A compact sintered product having a relative density of 99% or higher, a thermal conductivity of 0.55 cal/cm.sec.°C. at room temperature, an electrical resistivity of $8 \times 10^{14}$ Ωcm at room temperature, and a coefficient of thermal expansion of $4.3 \times 10^{-6}$/°C. at room temperature was obtained.

Furthermore, sintered products were prepared in the same manner as above while using 0.05 to 10% by weight of beryllium oxide and 0.05–5% by weight of lithium carbonate while making the sum total of the beryllium oxide and the lithium oxide not more than 5% by weight in terms of beryllium and lithium atoms, when the amount of lithium carbonate took the major proportion and making the sum total of the beryllium oxide and the lithium carbonate not more than 10% by weight in terms of beryllium and lithium atoms, when the amount of beryllium oxide took the major proportion. The resulting sintered products had a relative density of 90% or higher, a thermal conductivity of 0.2 cal/cm.sec.°C. or higher at room temperature, an electrical resistivity of $10^{12}$ Ω.cm or higher at room temperature, and a coefficient of thermal expansion of $5 \times 10^{-6}$/°C. or lower at room temperature.

Application Example

As a definite example of the electrically insulating substrate in accordance with the present invention, a semi-conductor power module was produced using the sintered aluminum nitride of 1.0 wt.% beryllium content obtained in Example 1, and that of 1.0 wt.% lithium content obtained in Example 6.

Figure 5:
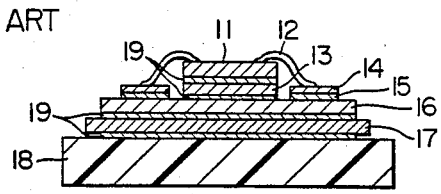
FIG. 5 is a sectional view of a conventional silicon semiconductor device.
Figure 3:
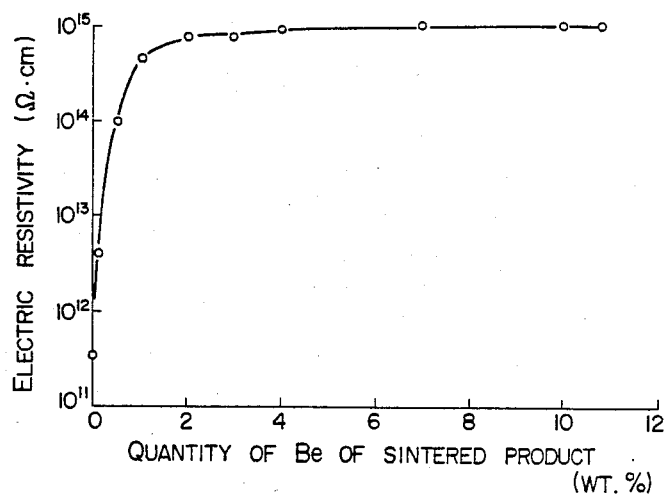
FIG. 3 is a diagram showing the relationship between the Be quantity and the electrical resistivity of the sintered product at 25° C.
Figure 4:
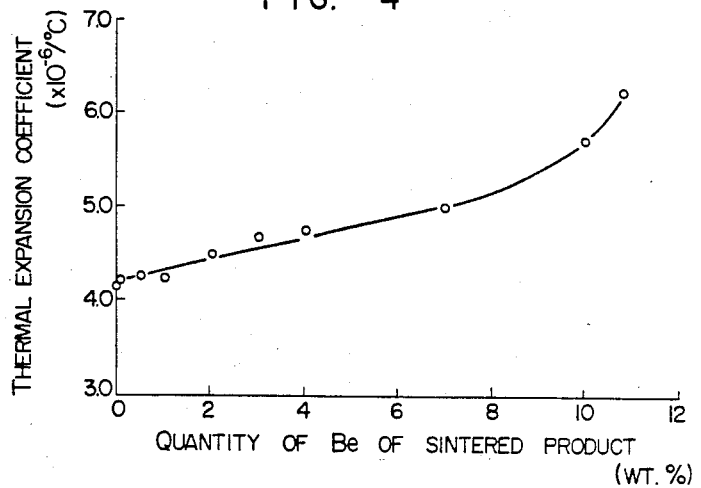
FIG. 4 is a diagram showing the relationship between the Be quantity and the coefficient of thermal expansion of the sintered product from 25° C. to 300° C.

FIG. 5 shows the section of a semiconductor power module assembly of the prior art. An organic insulating material 15 is interposed for insulation between a Cu conductor 14 and a Cu heat sink 16 while an aluminum substrate 17 is interposed for insulation between the heat sink 16 and a Cu metal support 18. A spacer 13 is interposed in order to mitigate strain due to the difference of thermal expansion coefficients between a silicon element 11 and the Cu heat sink 16. Reference numeral 12 denotes an aluminum lead wire while reference numeral 19 denotes a solder.

Figure 6:
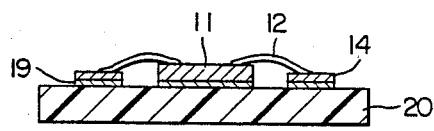
FIG. 6 is a sectional view of a silicon semiconductor device using the insulating substrate of the present invention.

FIG. 6 is a sectional view of the module assembly using the insulating substrate in accordance with the present invention. The substrate 20 of the present invention has an extremely simple construction in which the substrate is directly brazed to the silicon element 11 via the solder 19, with or without metallizing the contact surface of the substrate.

According to the construction shown in FIG. 6, it is possible to replace the spacer 13, the organic insulating material 15, the Cu heat sink 16, the alumina substrate 17 and the metal support 18, each shown in FIG. 5, by the single substrate 20 shown in FIG. 6.

The abovementioned semiconductor device was held at −60° C. for 30 minutes, then at room temperature for 5 minutes and thereafter heated to 125° C. and held at that temperature for 30 minutes. When this heat cycle was applied 20 times to the semiconductor device of the prior art shown in FIG. 5, crack occurred on the alumina substrate and soldered positions peeled off. When the same heat cycle was applied 150 times to the semiconductor device of the present invention shown in FIG. 6, no abnormality was observed.

Comparative Example

Aluminum nitride powder having a purity of 99% and an average particle size of 2 μm was admixed with 10% by weight of yttrium oxide in terms of yttrium atom on the basis of aluminum nitride, and molded under pressure in the same manner as in Example 1. The resulting molding was sintered in a vacuum furnace at 1,800° C. under $1 \times 10^{-3}$ Torr for half an hour. A compact sintered product having a relative density of 99% was obtained and had a thermal conductivity of 0.07 cal/cm.sec.°C. at room temperature, an electrical resistivity of $10^{11}$ Ω.cm at room temperature, and an average coefficient of thermal expansion of $5.0 \times 10^{-6}$/°C. between room temperature and 300° C. The thermal conductivity was considerably lower than that of the present sintered products.

As is evident from the foregoing Examples, the present sintered aluminum nitride is compact and has a high thermal conductivity, a high electrical resistivity and a low coefficient of thermal expansion. Thus, the present sintered product is useful not only as an electrically insulating substrate material, but also as a heat-resistant, antioxidant or chemical-resistant material and also as a material having a high mechanical strength at a high temperature. Particularly the present sintered product has equivalent functions and effects to those of the sintered silicon carbide, and also has such additional merits as a firing temperature by 300°–500° C. lower than that of the silicon carbide and a higher electrical resistivity, and consequent economical saving in power and material consumption.

What is claimed is:

1. A semi-conductor device which comprises an insulating substrate of sintered aluminum nitride having a high thermal conductivity, which comprises at least 65% by weight of aluminum nitride and at least one of beryllium, beryllium compound, lithium and lithium compound, and a semi-conductor element disposed on the substrate.

2. The semi-conductor device according to claim 1, 0.05 to 10% by weight of at least one of the beryllium and the beryllium compound in terms of beryllium atom is contained in the sintered aluminum nitride on the base of aluminum nitride.

3. The semi-conductor device according to claim 1, wherein 0.05–5% by weight of at least one of the lithium and the lithium compound in terms of lithium atom is contained in the sintered aluminum nitride on the basis of aluminum nitride.

4. The semi-conductor device according to claim 1, wherein 0.05 to 10% by weight of at least one of the beryllium and the beryllium compound in terms of beryllium atom and 0.05 to 5% by weight of at least one of the lithium and the lithium compound in terms of lithium atom are contained in the sintered aluminum nitride on the basis of aluminum nitride, and when at least one of the lithium and the lithium compound takes the major proportion, the sum total of at least one of the beryllium and the beryllium compound and at least one of the lithium and the lithium compound is not more than 5% by weight in terms of beryllium and lithium atoms, and when at least one of the beryllium and the beryllium compound takes the major portion, the sum total of at least one of the beryllium and the beryllium compound and at least one of the lithium and the lithium compound is not more than 10% by weight in the term of beryllium and lithium atoms on the basis of aluminum nitride.

5. The semi-conductor device according to claim 1, wherein not more than 5% by weight of at least one of $Y_2O_3$, MgO, $Al_2O_3$ and $SiO_2$ in terms of atom is contained on the basis of aluminum nitride.

6. The semi-conductor device according to claim 1, wherein the sintered aluminum nitride has a density of 90% or more of its theoretical density.

7. The semi-conductor device according to claim 1, wherein the sintered aluminum nitride has a thermal conductivity of 0.2 cal/cm.sec.°C. or higher at room temperature.

8. The semi-conductor device according to claim 1, wherein the sintered aluminum nitride has an electrical resistivity of $10^{12}$ $\Omega$.cm or higher at room temperature.

9. The semi-conductor device according to claim 1, wherein the sintered aluminum nitride has an average coefficient of thermal expansion of $5 \times 10^{-6}$/°C. or less between room temperature and 300° C.

10. The semi-conductor device according to claim 1, wherein the semi-conductor element is brazed to the surface of the insulating substrate through a metalized layer formed on the surface of the insulating substrate.

11. The semi-conductor device according to claim 1, wherein the semi-conductor element is silicon.

* * * * *